United States Patent
Nojiri et al.

(10) Patent No.: US 6,611,468 B2
(45) Date of Patent: Aug. 26, 2003

(54) NON-VOLATILE SEMICONDUCTOR MEMORY DEVICE HAVING SENSITIVE SENSE AMPLIFIER STRUCTURE

(75) Inventors: Isao Nojiri, Hyogo (JP); Atsushi Ohba, Hyogo (JP); Yoshihide Kai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/931,759

(22) Filed: Aug. 20, 2001

(65) Prior Publication Data

US 2002/0101775 A1 Aug. 1, 2002

(30) Foreign Application Priority Data

Jan. 31, 2001 (JP) .......................................... 2001-023188

(51) Int. Cl.[7] ................................................. G11C 7/02
(52) U.S. Cl. ............. 365/207; 365/185.03; 365/185.18; 365/185.2; 365/185.21
(58) Field of Search ........................ 365/185.03, 185.18, 365/185.2, 185.21, 189.09, 207, 208

(56) References Cited

U.S. PATENT DOCUMENTS

| | | | | |
|---|---|---|---|---|
| 5,276,644 | A | * | 1/1994 | Pascucci et al. ........ 365/185.21 |
| 5,729,490 | A | * | 3/1998 | Calligaro et al. ....... 365/185.03 |
| 5,729,493 | A | | 3/1998 | Morton |
| 6,301,149 | B1 | * | 10/2001 | Micheloni et al. .......... 365/168 |
| 6,323,693 | B1 | * | 11/2001 | Park ............................ 327/52 |
| 6,400,607 | B1 | * | 6/2002 | Pasotti et al. .......... 365/185.21 |

FOREIGN PATENT DOCUMENTS

JP        10-083682       3/1998

* cited by examiner

Primary Examiner—Van Thu Nguyen
(74) Attorney, Agent, or Firm—McDermott, Will & Emery (57) ABSTRACT

In a non-volatile semiconductor memory device, a constant current circuit is arranged in parallel with an NMOS diode converting a detected current on the array cell side to a voltage, and a constant current circuit is arranged in parallel with an NMOS diode converting a detected current on the reference cell side to a voltage. Constant current circuits supply an offset current. Thus, a difference between two input voltages of a differential amplifier increases.

13 Claims, 11 Drawing Sheets

WITHOUT OFFSET CURRENT

| NODE | POTENTIAL | NODE | POTENTIAL | POTENTIAL DIFFERENCE |
|---|---|---|---|---|
| B3 | 1.56V | A3 | 1.23V | 0.33 |
| B2 | 1.36V | A2 | 1.23V | 0.13 |
| B1 | 1.21V | A1 | 1.23V | −0.02 |

FIG.10B

WITH OFFSET CURRENT

| NODE | POTENTIAL | NODE | POTENTIAL | POTENTIAL DIFFERENCE |
|---|---|---|---|---|
| B3 | 1.15V | A3 | 0.09V | 1.16 |
| B2 | 1.18V | A2 | 1.00V | 0.18 |
| B1 | 1.21V | A1 | 1.23V | −0.02 |

NON-VOLATILE SEMICONDUCTOR MEMORY DEVICE HAVING SENSITIVE SENSE AMPLIFIER STRUCTURE

BACKGROUND OF THE INVENTION

1. Field of the Invention

The present invention relates to a non-volatile semiconductor memory device, and more specifically to a structure for reading data of a non-volatile memory cell.

2. Description of the Background Art

A conventional non-volatile semiconductor memory device basically reads data using a differential amplifier.

Figure 12:
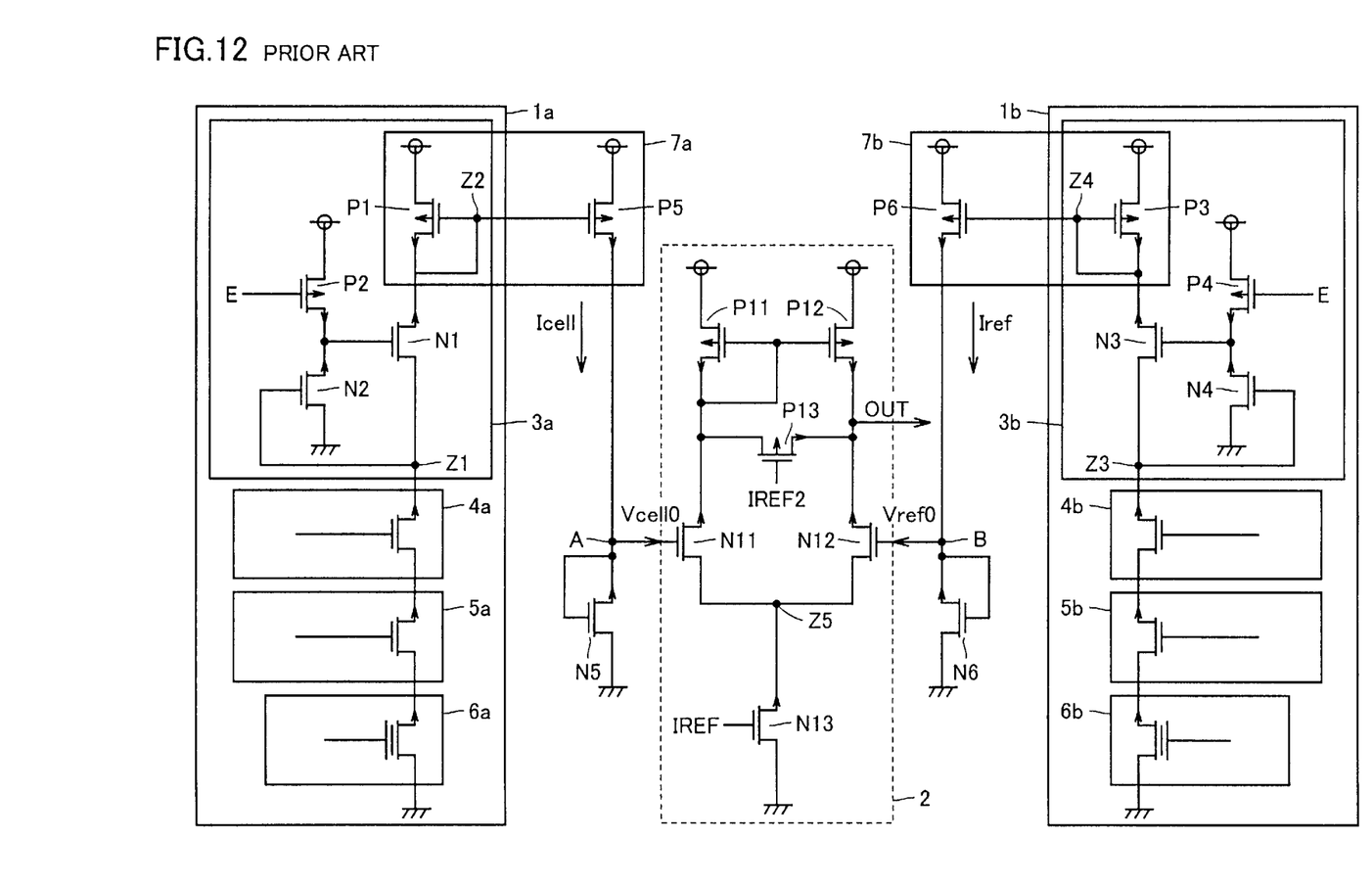
FIG. 12 is a diagram showing a main structure of the conventional non-volatile semiconductor memory device.

The structure of a sense amplifier for reading data in the conventional non-volatile semiconductor memory device will be described with reference to FIG. 12. A memory cell from which data is read is referred to as an array cell 6a, and a reference cell used for detecting data of array cell 6a is referred to as a reference cell 6b.

Array cell 6a is connected to a current detecting portion 3a through Y gates (NMOS transistors) 4a and 5a, and reference cell 6b is connected to current detecting portion 3a through Y gates (NMOS transistors) 4b and 5b.

Current detecting portion 3a, Y gates 4a, 5a and array cell 6a are collectively shown as a pre-sense amplifier portion 1a. Current detecting portion 3b, Y gates 4b, 5b and reference cell 6b are collectively shown as a pre-sense amplifier portion 1b.

Current detecting portion 3a includes PMOS transistors P1 and P2 as well as NMOS transistors N1 and N2. Transistors P2 and N2 are connected in series between a power supply node receiving a power supply voltage Vcc and a node GND receiving a ground voltage. Transistor P2 has its gate receiving an enable signal E controlling activation/inactivation, whereas transistor N2 has its gate connected to a node Z1.

Transistors P1 and N2 are connected in series between the power supply node and node Z1, and transistor N1 has its gate connected to a connection node of transistors P2 and N2.

When a word line VWL for driving the gate of array cell 6a is activated and Y gates 4a, 5a are turned on, the drain of array cell 6a is connected to current detecting portion 3a (selection of array cell 6a).

Current detecting portion 3b includes PMOS transistors P3 and P4 as well as NMOS transistors N3 and N4. Transistors P4 and N4 are connected in series between the power supply node receiving the power supply voltage and node GND. Transistor P4 has its gate receiving enable signal E, and transistor N4 has its gate connected to a node Z3.

Transistors P3 and N3 are connected in series between the power supply node and node Z3, and transistor N3 has its gate connected to the connection node of transistors P4 and N4.

When word line VWL for driving the gate of reference cell 6b is activated and Y gates 4b, 5b are turned on, the drain of reference cell 6b is connected to current detecting portion 3b.

It is noted that although the Y gates are shown as two stages of NMOS transistors, the number of stages or elements are not limited to this.

The current of array cell 6a detected by current detecting portion 3a is transferred to an NMOS diode N5 through a PMOS transistor P5 connected to form a current mirror 7a with transistor P1. A signal received by the gates of transistors P1 and P5 and a node connected to the gates are collectively indicated as Z2. A reference character Icell represents the detected current flowing through transistor P5.

The current of reference cell 6b detected by current detecting portion 3b is transferred to an NMOS diode N6 through a PMOS transistor P6 connected to form a current mirror 7b with transistor P3. A signal received by the gates of transistors P3 and P6 and a node connected to the gates are collectively indicated as Z4. Reference character Iref represents the detected current flowing through transistor P6.

Transistors P5 and P6 are respectively connected to NMOS diodes N5 and N6 at a first input node A and a second node B of a differential amplifier 2.

Current Icell is converted to a voltage Vcell0 by NMOS diode N5 which is a current voltage converting element. Current Iref is converted to voltage Vref0 by NMOS diode N6 which is also a current voltage converting element.

It is noted that, with regard to a circuit from the current detecting portion to the current voltage converting portion, similar elements are used for both of an array cell and a reference cell.

Differential amplifier 2 includes PMOS transistors P11, P12, P13 and NMOS transistors N11, N12, N13. Transistors P11 and N11 are connected in series between the power supply node and a node Z5, and transistor N11 has its gate connected to a node A. Transistors P12 and N12 are connected in series between the power supply node and node Z5, and transistor N12 has its gate connected to node B.

Transistor N13 is connected between node Z5 and node GND, and has its gate receiving a control signal IREF. Transistor P13 is connected between a connection node of transistors P11, N11 and a connection node of transistors P12, N12, and has its gate receiving a control signal IREF2.

Differential amplifier 2 detects a small voltage difference between nodes A and B (a difference between voltage Vcell0 and voltage Vref0), and outputs the detection result from a connection node OUT of transistors P12 and N12. An output circuit (not shown) converts the output from differential amplifier 2 to a signal at a logic level for output.

In a conventional sense amplifier circuit, a diode is used for the voltage converting portion in order to ultimately convert the detected current to a voltage. Hence, the voltage difference between the array cell and reference cell is not so large. Thus, differential amplifier 2 is used to detect the difference of the small voltage.

However, if a multi-level cell is used which allows a plurality of pieces of information to be stored in a single memory cell depending on a situation of a threshold value, a value of current to be detected would be even smaller. Thus, the conventional sense amplifier circuit cannot properly detect a voltage difference.

By contrast, a gain may be obtained with differential amplifiers connected in two stages to provide enhanced detection sensitivity. However, with the greater number of differential amplifiers, a delay time would be longer because of operations of the differential amplifiers in two stages. As a result, a greater amount of current would be consumed by a larger circuit.

SUMMARY OF THE INVENTION

An object of the present invention is to provide a semiconductor memory device capable of precisely reading data with a simple circuit structure.

A non-volatile semiconductor memory device according to one aspect of the present invention includes: a non-volatile memory cell; a reference cell determining stored data of the memory cell; a differential amplifier detecting a difference between voltages at first and second input nodes; a first current voltage converting element connected to the first input node for converting a first read current from the memory cell to a voltage; a second current voltage converting element connected to the second input node for converting a second read current from the reference cell to a voltage; and a gain adjusting circuit adjusting a detection sensitivity of a differential amplifier by adjusting values of the first and second read currents.

Preferably, the first and second current voltage converting elements respectively include diode elements, and the gain adjusting circuit includes a constant current circuit for supplying offset currents to the first and second input nodes.

In particular, the constant current circuit includes a first constant current circuit connected to the first input node, and a second constant current circuit connected to the second input node. The first and second constant current circuits supply substantially the same current.

Preferably, the gain adjusting circuit includes: a drive circuit generating a current with a value lower than that of the second read current based on the second read current for converting the generated current to a voltage; a first element connected to the first input node for supplying a first offset current based on the voltage obtained from the drive circuit; and a second element connected to the second input node for supplying a second offset current based on the voltage obtained from the drive circuit. The first and second offset currents have substantially the same value.

Preferably, the gain adjusting circuit includes: a drive circuit generating a current with a value lower than that of the second read current based on the second read current for converting the generated current to a voltage; a first element connected to the first input node for supplying a current with a value lower than that of the second read current to the second current voltage converting element; and a second element connected to the second input node for supplying an offset current based on the voltage obtained from the drive circuit.

Preferably, the first and second current voltage converting elements include resistive elements, and the gain adjusting circuit includes a constant current circuit supplying offset currents to the first and second input nodes.

A non-volatile semiconductor memory device according to another aspect of the present invention includes: a non-volatile memory cell capable of operating in n storage states (n is an integer of at least 3); k (k is an integer of at least 2) reference cells for determining the n storage states; k first current voltage converting elements each converting a first read current of the memory cell to a voltage; k second current voltage converting elements converting k second read currents from the k reference cells to voltages; k differential amplifiers detecting differences between an output from the first current voltage converting element and respective outputs from the k second current voltage converting elements; and a gain adjusting circuit adjusting detection sensitivities of k differential amplifiers by adjusting the values of the k second read currents and the first read current.

Preferably, each of the first current voltage converting element and the k second current voltage converting elements includes a diode element, and the gain adjusting circuit includes a constant current circuit for reducing an input current to the first current voltage converting element and at least one of k second current voltage converting element.

Preferably, the gain adjusting circuit includes a constant current circuit changing the input current to each of the first current voltage converting element and k second current voltage converting elements according to the detection sensitivities of the k differential amplifiers. The constant current circuit causes the input current to respective k second current voltage converting elements to have substantially the same value.

Preferably, the constant current circuit includes a circuit for generating (k−j) offset currents using j (j is an integer of at least 1 and at most (k−1))of the k second read currents, and reduces input current to (k−j) second current voltage converting elements by (k−j) offset currents.

Preferably, the first current voltage converting element and k second current voltage converting elements respectively include resistive elements, and the gain adjusting circuit includes a constant current circuit for reducing input currents to the first current voltage converting element and at least one of k second current voltage converting elements.

As described above, according to the non-volatile semiconductor memory device of the present invention, a detection sensitivity is enhanced.

According to the non-volatile semiconductor memory device of the present invention, the detection sensitivity can be enhanced without increasing the size of the circuit structure.

According to the non-volatile semiconductor memory device of the present invention, a detection sensitivity can be enhanced without decreasing the operation speed.

According to the non-volatile semiconductor memory device of the present invention, a detection sensitivity can be enhanced without increasing power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, non-volatile semiconductor memory devices according to the embodiments of the present invention will be described with reference to the drawings. In the following, the same or corresponding portions are denoted by the same reference characters, and description thereof will not be repeated.

First Embodiment

A non-volatile semiconductor memory device of the first embodiment will be described with reference to FIG. 1. The non-volatile semiconductor memory device of the first embodiment is provided with a sense amplifier circuit having high detection sensitivity.

Figure 1:
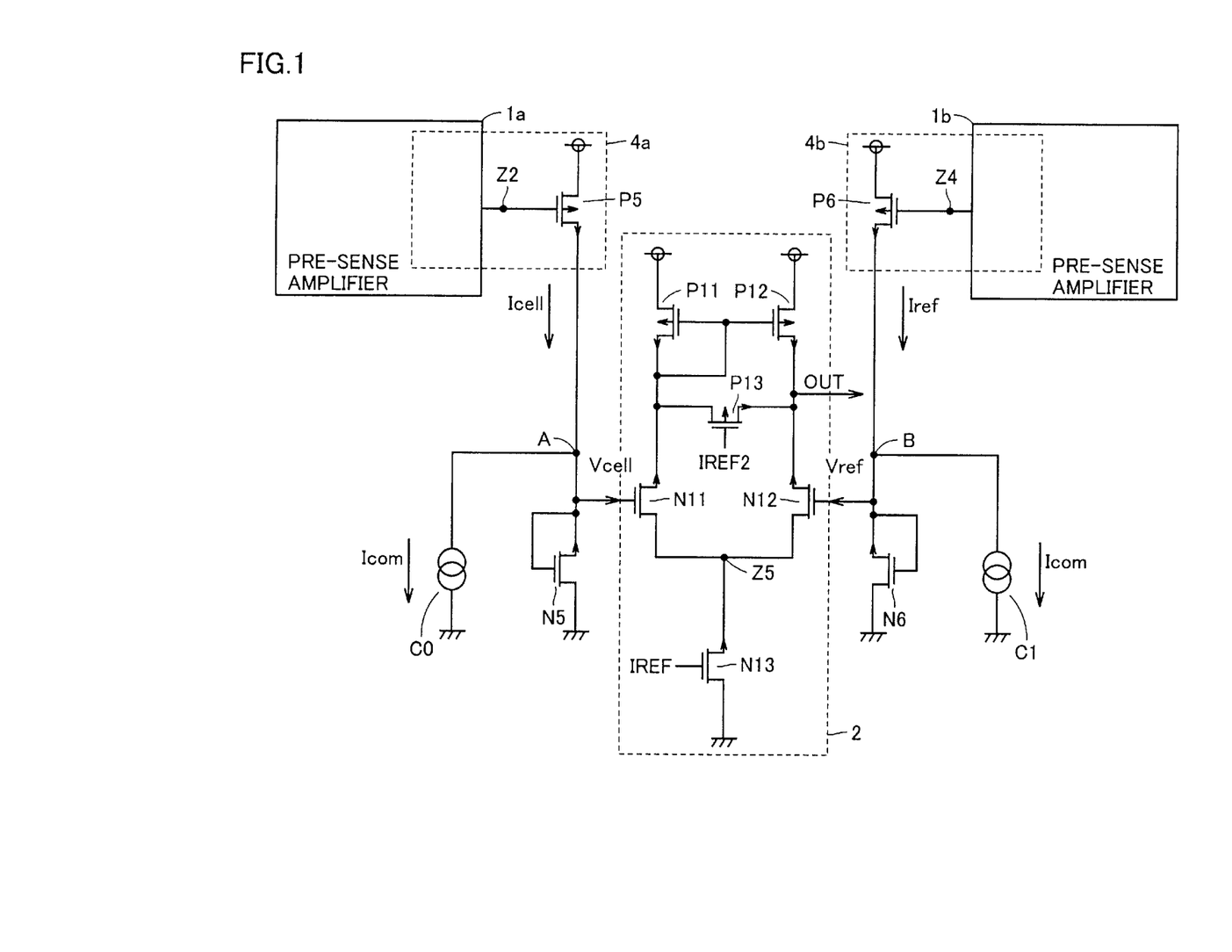
FIG. 1 is a diagram showing a main structure of a non-volatile semiconductor memory device of a first embodiment.

Referring to FIG. 1, a memory cell (an array cell 6a) from which data is read is connected to a current detecting portion through a Y gate. As stated previously, reference character 1a represents a pre-sense amplifier portion including a current detecting portion 3a, Y gates 4a, 5a and array cell 6a.

Similarly, a reference cell (a reference cell 6b) used for detecting data of array cell 6a is connected to the current detecting portion through the Y gate. As stated previously, reference character 1b represents a pre-sense amplifier portion including a current detecting portion 3b, Y gates 4b, 5b and reference cell 6b.

A current detected by pre-sense amplifier portion 1a is supplied to an NMOS diode N5 and a constant current circuit C0 connected to a first input node A of a differential amplifier 2 through a current mirror 7a (including transistors P1 and P5).

A current detected by pre-sense amplifier portion 1b is supplied to an NMOS diode N6 and a constant current circuit C1 connected to a second input node B of differential amplifier 2 through a current mirror 7b (including transistors P3 and P6). Constant current circuits C0 and C1 supply a constant current Icom.

Differential amplifier 2 detects a difference between voltages Vcell and Vref, respectively at nodes A and B, and outputs the detection result from a node OUT.

Figure 2:
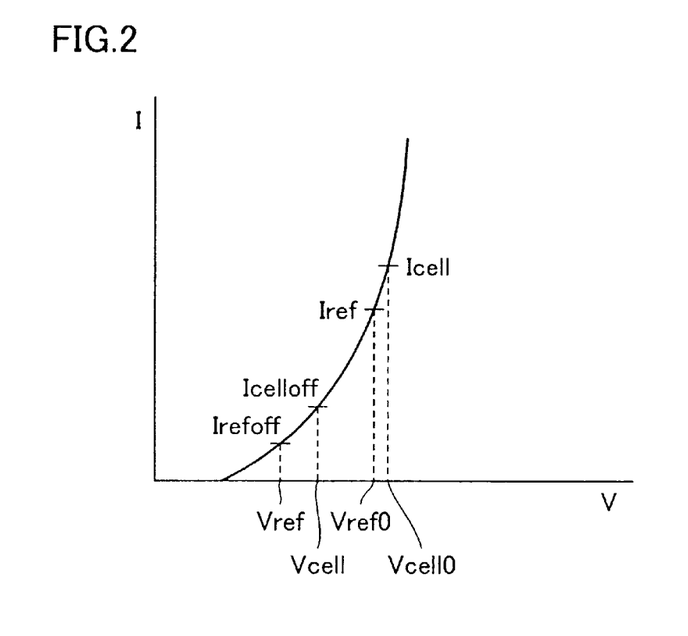
FIG. 2 is a graph showing a voltage-current characteristic (I-V characteristic) of NMOS diodes N5 and N6.

A voltage-current characteristic (I-V characteristic) of NMOS diodes N5 and N6 will be described with reference to FIG. 2. It is noted that FIG. 2 shows a property of the transistor in a saturation region. The I-V characteristic generally exhibits a quadratic curve.

In the conventional structure, detection currents Iref and Icell are both relatively large. Accordingly, there is a small current difference, and a difference |Vref0−Vcell0| of voltages Vcell0, Vref0 obtained by NMOS diodes N5 and N6 is small.

On the other hand, in the structure of the first embodiment, the same offset current Icom is supplied to the reference and array cell sides by constant current circuits C0 and C1. Thus, the amounts of currents flowing through NMOS diodes N5 and N6 are smaller by an amount of offset current. Given that currents Icelloff, Irefoff are supplied to the NMOS diodes, a relation of |Icell−Iref|>|Icelloff−Irefoff| is established.

Then, a relation of |Vref0−Vcell0|<|Vref−Vcell| is established. Accordingly, with the structure of the first embodiment, since a slight change in current can be converted to a large change in voltage, a high detection sensitivity can be provided.

Figure 11:
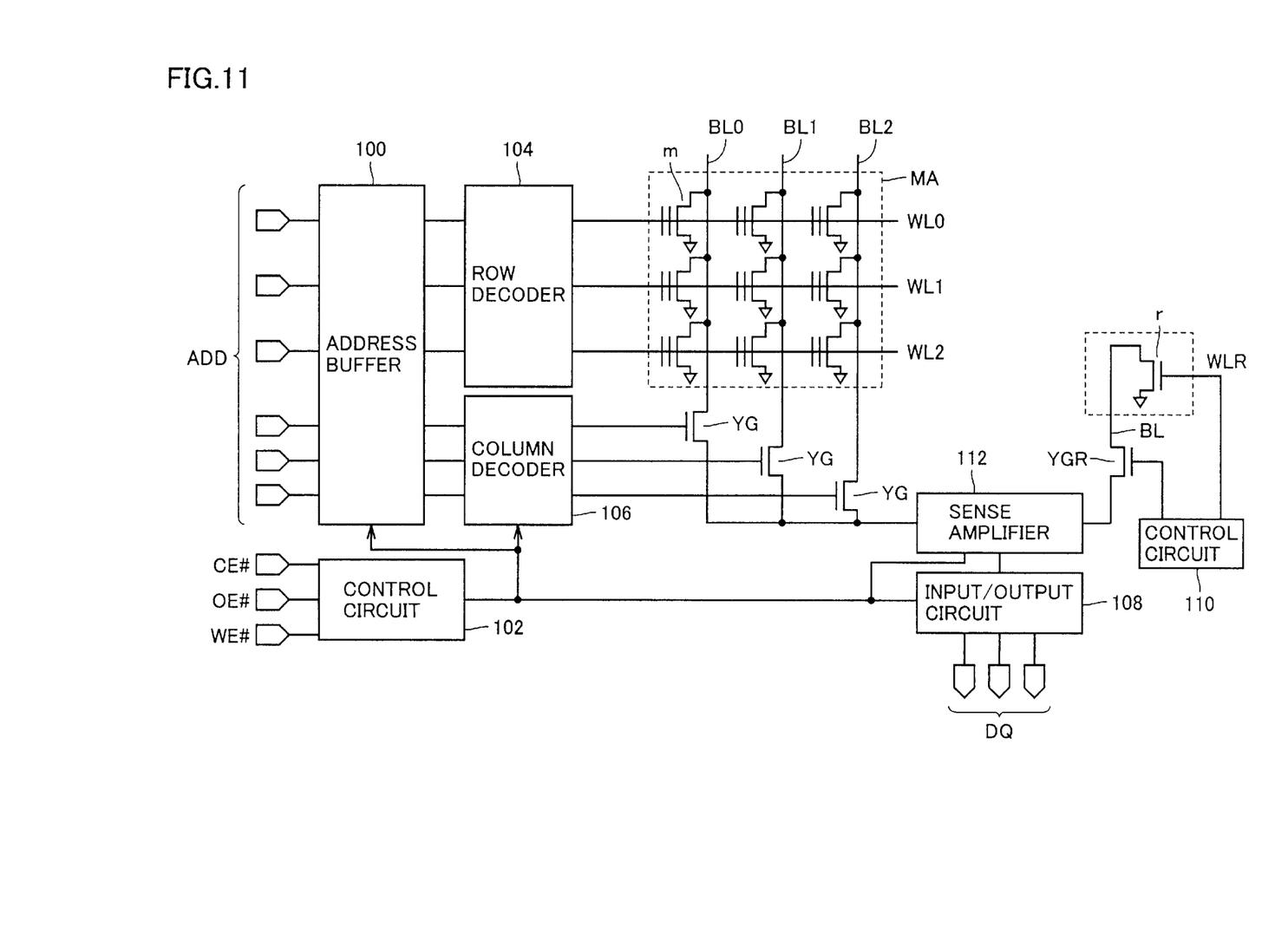
FIG. 11 is a diagram showing a main structure of a non-volatile semiconductor memory device 1000 of the present invention.

An exemplary overall structure of a non-volatile semiconductor memory device 1000 having the above described structure will be described with reference to FIG. 11. Non-volatile semiconductor memory device 1000 includes, as shown in FIG. 11: a memory cell array MA having a plurality of memory cells m arranged in a row and a column direction, word lines WL0, WL1, WL2 ... arranged in a row direction and bit lines BL0, BL1, BL2 ... arranged in a column direction; an address buffer 100 receiving an external address signal from address pins ADD; a control circuit 102 receiving external control signals from control pins (CE#, OE#, WE#) for outputting an internal control signal; a row decoder 104 decoding an internal row address output from address buffer 100 for selecting a row of memory cell array MA; a column decoder 106 decoding an internal column address output from address buffer 100 for selecting a column of memory cell array MA; and Y gates YG arranged corresponding to bit lines and turned on by outputs from column decoder 106.

Non-volatile semiconductor memory device 1000 further includes: an input/output circuit 108 receiving data from data input/output pins DQ or outputting data read from memory cell array MA onto data input/output pins DQ; a reference cell r; a Y gate YGR connected to bit line BL of reference cell r; a control circuit 110 selecting a row (WLR) of reference cell r and Y gate YGR; and a sense amplifier 112 detecting a difference between read currents of the memory cell and reference cell. The above mentioned current detecting portion, NMOS diode, constant current circuit and differential amplifier are included in sense amplifier 112.

Second Embodiment

Figure 3:
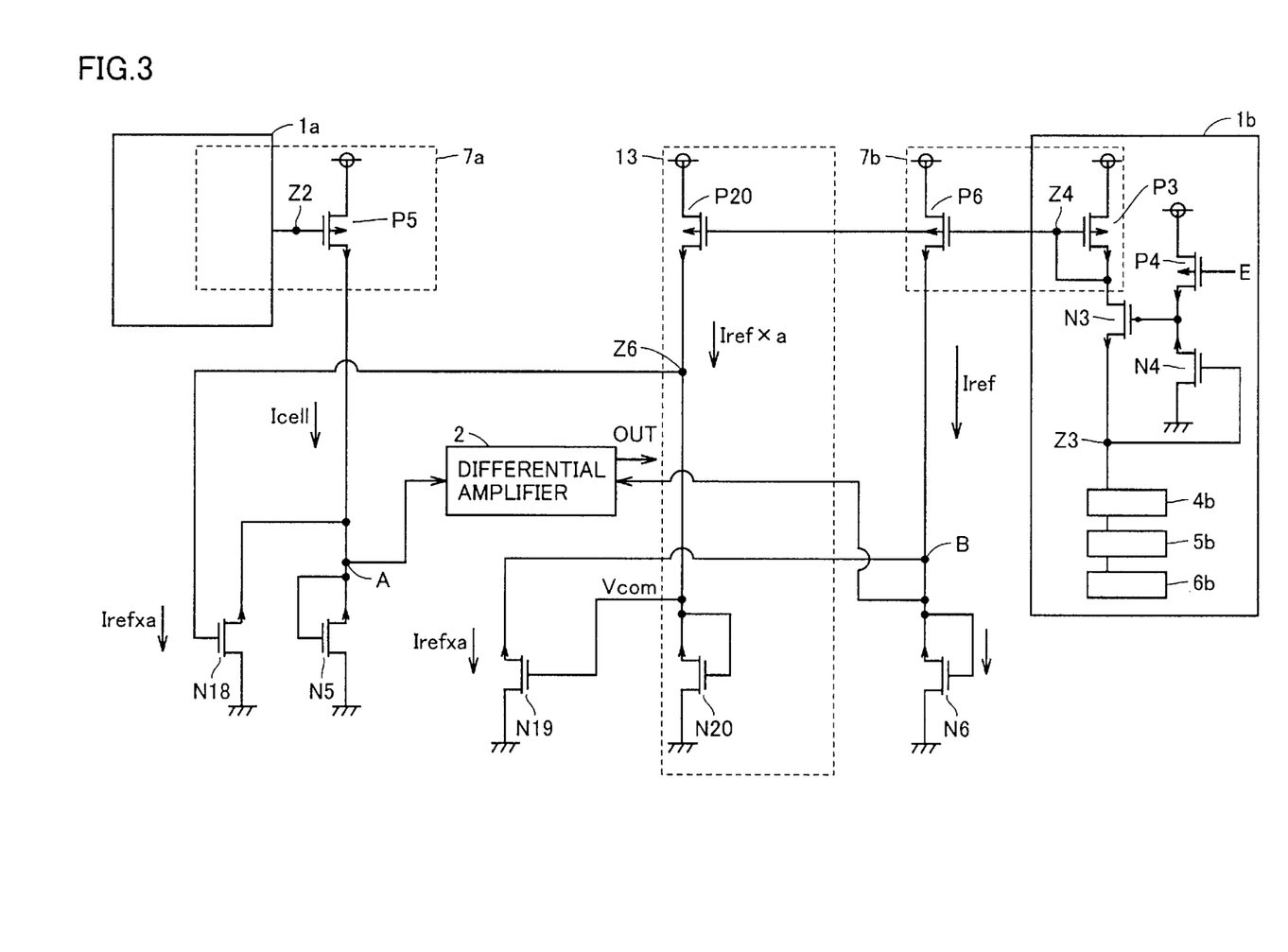
FIG. 3 is a diagram showing an exemplary structure of a constant current circuit of a second embodiment.

In the second embodiment, an exemplary constant current circuit of the first embodiment will be described in detail. Referring to FIG. 3, a drive circuit 13 including PMOS transistor P20 and NMOS diode N20 as well as NMOS transistors N18, N19 form constant current circuits C0 and C1.

Transistor P20 is connected between a node receiving a power supply voltage and a node Z6. Transistor P20 has its gate receiving a signal Z2 like the gate of transistor P6 which is an element of current mirror 7a. NMOS diode N20 is connected between nodes Z6 and GND.

Transistor N18 is connected between nodes A and GND and has its gate receiving a voltage signal Vcom of node Z6. Transistor N19 is connected between nodes B and GND and has its gate receiving voltage signal Vcom of node Z6.

Transistor P3 of pre-sense amplifier portion 1b on the reference side forms a current mirror with transistor P6 and forms a current mirror with transistor P20. The size ratio of the PMOS transistor is adjusted to make current Iref×a flowing through transistor P20 smaller than detection current Iref (Iref×a<Iref:0<a<1).

Current Iref×a obtained by transistor P20 is converted to voltage Vcom by NMOS diode N20. Voltage Vcom is applied to the gates of NMOS transistors N18 and N19 to provide constant current. NMOS diode N20 and transistors N18, N19 have substantially the same size, and an offset current Iref×a is supplied by transistors N18 and N19.

According to the second embodiment, the offset current is generated by directly utilizing the current detected on the reference side, so that a simplified circuit structure is provided.

Third Embodiment

The third embodiment is a modification of the second embodiment. In the second embodiment, the structure of supplying offset current Irefxa is shown. In the third embodiment, by changing the size ratio of the PMOS transistor forming the current mirror, a current Irefx(1−a) is supplied to the first input node of the differential amplifier.

Figure 4:
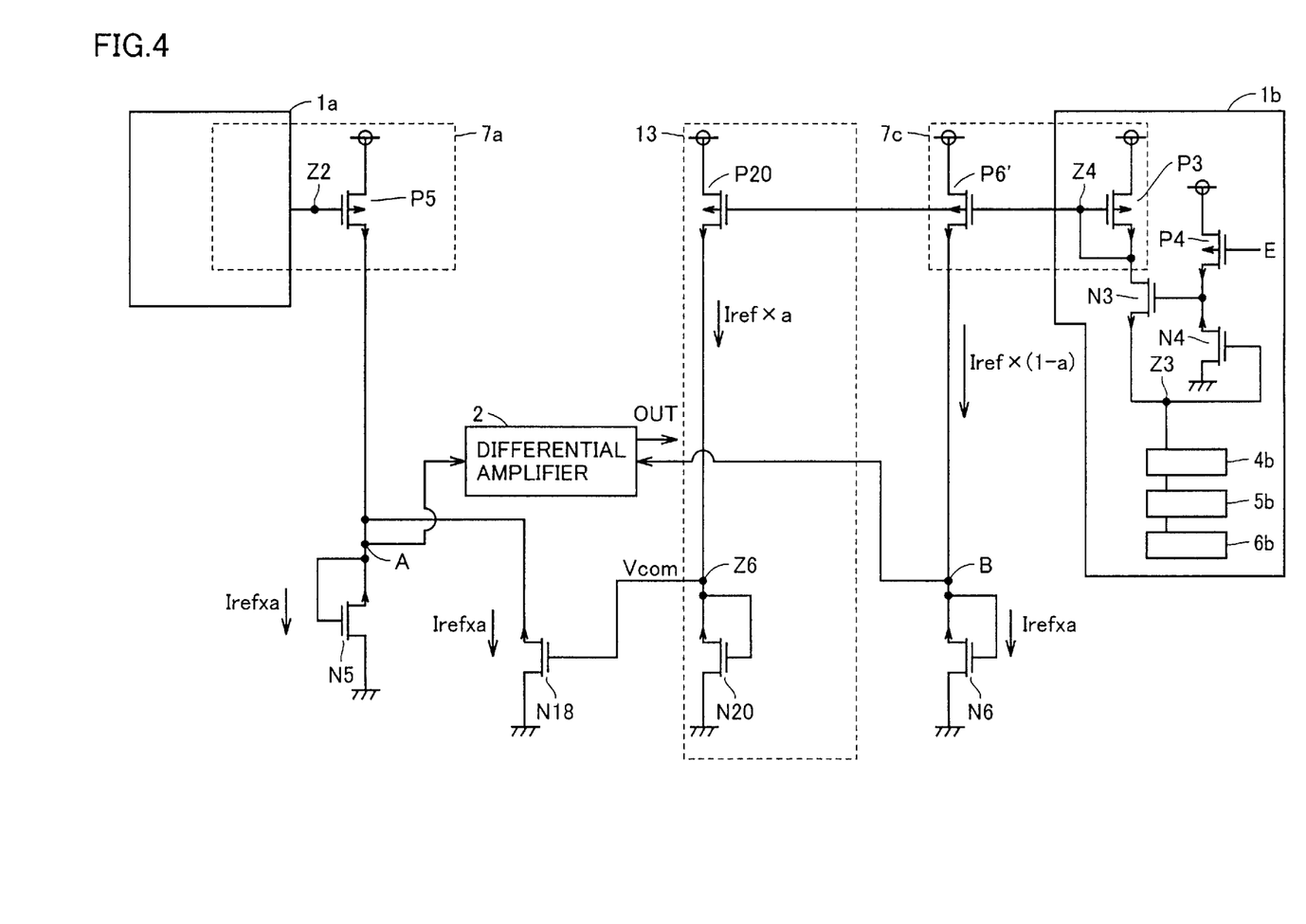
FIG. 4 is a diagram showing an exemplary structure of a non-volatile semiconductor memory device of a third embodiment.

Referring to FIG. 4, a PMOS transistor P6' is arranged in place of transistor P6. Transistor P6' forms a current mirror 7c with a transistor P3 in a pre-sense amplifier portion 1b. Transistor P6' is connected between a power supply node and a node B and has its gate receiving a signal Z4.

Depending on the size ratio of transistors P3 and P6', current Irefx(1−a) is supplied to node B. Node B is connected to NMOS diode N6 which is a current voltage converting element. This makes the voltage supplied to input node B of differential amplifier 2 lower than in the conventional case.

In pre-sense amplifier portion 1a on the array cell side, a drive circuit 13 including PMOS transistor P20 and NMOS diode N20 as well as NMOS transistor N18 are arranged. The connecting relationship thereamong is as described above.

Transistors P3 and P20 form a current mirror. Transistor P20 supplies current Irefxa to node Z6, and NMOS diode N20 converts current Irefxa to voltage Vcom.

Transistor N18 having its gate connected to connection node Z6 of transistor P20 and NMOS diode N20 supplies offset current Irefxa.

This makes the voltage supplied to input node A of the differential amplifier lower than in the conventional structure. Consequently, the structure of the third embodiment produces an effect similar to that of the second embodiment.

It is noted that the same voltage is obtained irrespective of current mirrors and circuit constants give that a proportional relationship remains constant and, the same effect can be produced even if the size of the current mirror portion and its load circuit is multiplied by n for greater drivability.

Fourth Embodiment

Figure 5:
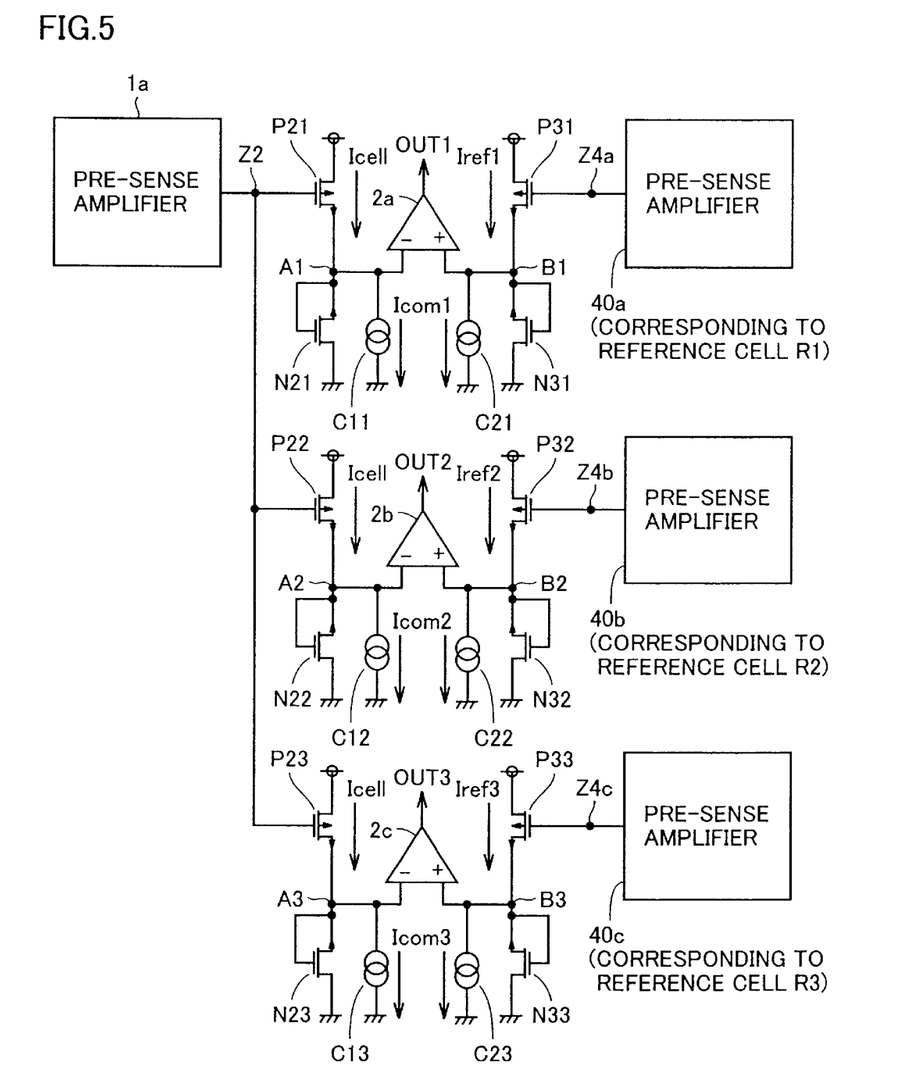
FIG. 5 is a diagram showing a main structure of a non-volatile semiconductor memory device of a fourth embodiment.

In the fourth embodiment, a reading structure of a non-volatile semiconductor memory device including a multi-level cell will be described. Referring to FIG. 5, an exemplary structure corresponding to a four-value cell capable of storing four data in accordance with a threshold value state will be described. To determine the level of a read current from an array cell among four levels, the read current is compared with three different current values.

Referring to FIG. 5, arranged on the array cell side are a pre-sense amplifier portion 1a, PMOS transistors P21, P22, P23 and NMOS diodes N21, N22, N23 which are current voltage converting elements.

Transistor P21 is arranged between a power supply node and a node A1, and NMOS diode N21 is connected between nodes A1 and GND. Transistor P22 is arranged between a power supply node and a node A2, and NMOS diode N22 is connected between nodes A2 and GND. Transistor P23 is arranged between a power supply node and node A3, and NMOS diode N23 is connected between nodes A3 and GND.

Transistors P21, P22, P23 each form a current mirror with transistor P1 of pre-sense amplifier portion 1a.

Constant current circuits C11, C12, C13 are respectively arranged for nodes A1, A2, A3. Constant current circuits C11, C12, C13 respectively supply currents Icom1, Icom2, Icom3.

Arranged on the reference cell side are pre-sense amplifier portions 40a, 40b, 40c, PMOS transistors P31, P32, P33 and NMOS diodes N31, N32, N33 which are current voltage converting elements. Pre-sense amplifier portions 40a, 40b, 40c have the same circuit structure as pre-sense amplifier portion 1b.

Pre-sense amplifier portions 40a, 40b, 40c respectively correspond to reference cells (denoted by R1, R2, R3) at different levels.

Each of transistors P31, P32, P33 forms a current mirror with a PMOS transistor (corresponding to transistor P3 of pre-sense amplifier portion 1b) included in pre-sense amplifier portions 40a, 40b, 40c. Signals (or node signals) received by gates of transistors P31, P32, P33 are respectively denoted by Z4a, Z4b and Z4c.

Transistor P31 is arranged between a power supply node and node B1, and NMOS diode N31 is connected between nodes B1 and GND. Transistor P32 is arranged between the power supply node and node B2, and NMOS diode N32 is connected between nodes B2 and GND. Transistor P33 is arranged between the power supply node and the node B3, and NMOS diode N33 is connected between nodes B3 and GND.

Currents respectively detected by pre-sense amplifier portions 40a, 40b, 40c and transistors P31, P32, P33 are denoted by Iref1, Iref2 and Iref3.

Constant current circuits C21, C22, C23 are respectively arranged for nodes B1, B2, B3. Constant current circuits C21, C22, C23 respectively supply currents Icom1, Icom2, Icom3.

Differential amplifier 2a detects a difference between voltages at nodes A1 and B1. A signal OUT1 is output as the detection result. Differential amplifier 2b detects a difference between voltages at nodes A2 and B2. A signal OUT2 is output as the detection result. Differential amplifier 2c detects a difference between voltages at nodes A3 and B3. A signal OUT3 is output as the detection result.

Signals OUT1, OUT2, and OUT3 are used to determine the level of data in the array cell from four levels.

Offset currents Icom1, Icom2, Icom3 supplied by constant current circuits are determined according to the detected levels.

In a read circuit corresponding to a conventional multi-level flash, the lower the threshold value is (flowing current is large), the lower the detection sensitivity is, due to the current-voltage property of the NMOS transistor.

By contrast, in the fourth embodiment, a prescribed offset current corresponding to a detection level can be supplied for each of the reference side and memory cell side. As a result, a greater detection sensitivity can be obtained at any level.

Fifth Embodiment

In the fifth embodiment, a modification of the fourth embodiment will be described. In the reading structure of the fourth embodiment, the structure of a constant current circuit is determined such that values obtained by subtracting offset currents from read currents are all same. This provides equalized detection sensitivities at all levels.

As an example, the read currents of reference cells R1, R2 and R3 are respectively 10 $\mu$A, 20 $\mu$A and 30 $\mu$A. On the other hand, a constant current circuit is formed such that offset currents Icom1, Icom2, Icom3 are respectively 5 $\mu$A, 15 $\mu$A, 25 $\mu$A. As a result, (Iref1−Icom1), (Iref2−Icom2), (Iref3−Icom3) are equalized. Accordingly, detection sensitivities at all levels can be equalized.

Sixth Embodiment

Figure 6:
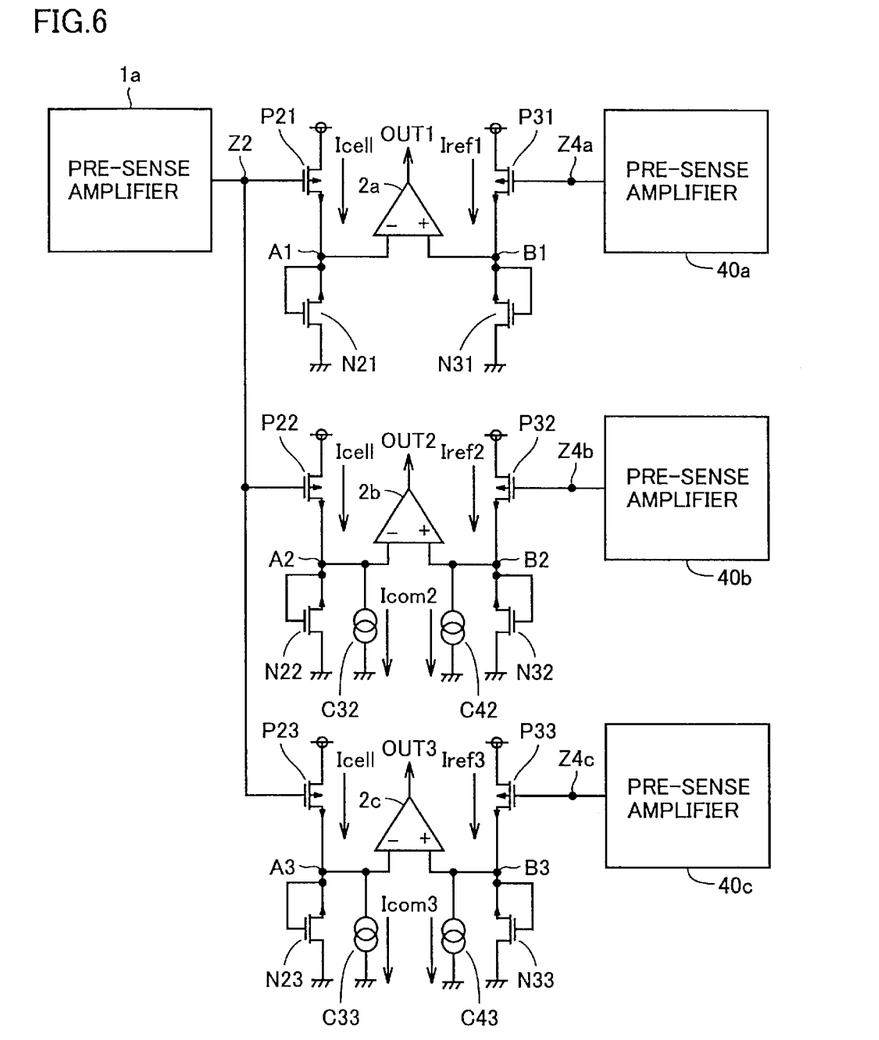
FIG. 6 is a diagram showing a main structure of a non-volatile semiconductor memory device of a second embodiment.
Figure 7:
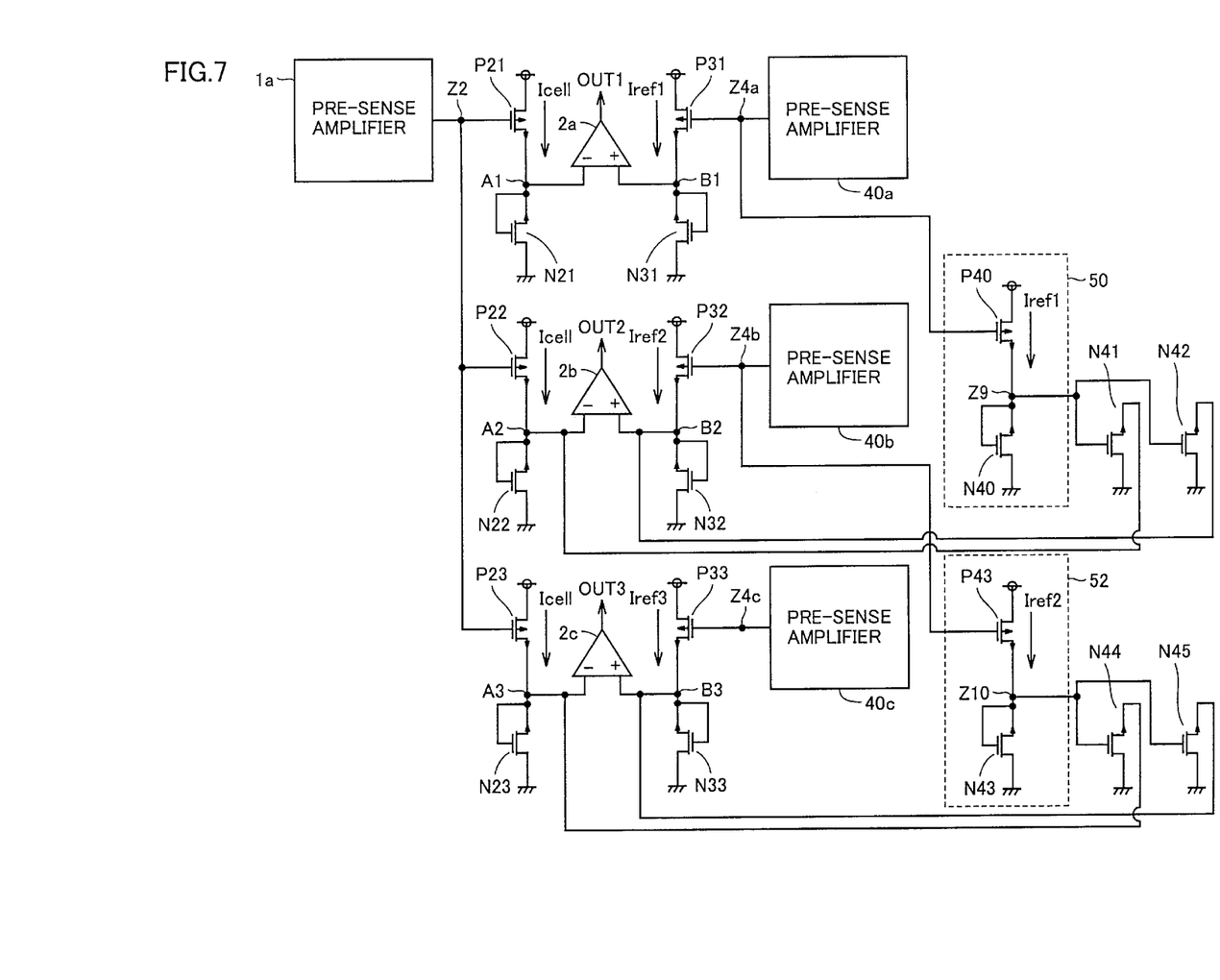
FIG. 7 is a diagram showing an exemplary structure of a constant current circuit of the sixth embodiment.

A sense amplifier structure of the sixth embodiment will be described. Referring to FIGS. 6 and 7, an exemplary structure corresponding to a four-value cell will be described. Referring to FIG. 6, on the array cell side, transistors P21, P22, P23, NMOS diodes N21, N22, N23 and constant current circuits C32, C33 are arranged for pre-sense amplifier portion 1a. A connection relationship among pre-sense amplifier portion 1a, transistors P21, P22, P23 and NMOS diodes N21, N22, N23 is as previously stated. Constant current circuits C32 and C33 are respectively connected to nodes A2 and A3. Constant current circuits C32 and C33 respectively supply currents Icom2, Icom3.

On the reference cell side, transistors P31, P32, P33, NMOS diodes N31, N32, N33 and constant current circuits C42, C43 are arranged for pre-sense amplifier portions 40a, 40b, 40c. The connecting relationship among pre-sense amplifier portions 40a, 40b, 40c, transistors P31, P32, P33 and NMOS diodes N31, N32, N33 is as previously stated. Constant current circuits C42 and C43 are respectively connected to nodes B2 and B3. Constant current circuits C42 and C43 respectively supply currents Icom2, Icom3.

Differential amplifiers 2a, 2b and 2c respectively detects differences of voltages at nodes A1 and B1, A2 and B2, and A3 and B3.

Offset current Icom2 is generated using reference current Iref1 lower by one stage. Offset current Icom3 is generated using reference current Iref2 lower by one stage.

More specifically, referring to FIG. 7, constant current circuits C32 and C42 are formed by a drive circuit 50 including PMOS transistor P40 and NMOS transistor N40, as well as NMOS transistors N41 and N42.

Constant current circuits C33 and C43 are formed by a drive circuit 52 including PMOS transistor P43 and NMOS transistor N43 as well as NMOS transistors N44 and N45.

Transistor P40 is connected between a power supply node and node Z9 and having its gate receiving signal Z4a. NMOS diode N40 is connected between nodes Z9 and GND. Transistor N41 is connected between nodes A2 and GND and has its gate connected to node Z9. Transistor N42 is connected between nodes B2 and GND and has its gate connected to node Z9. Current Iref1 is supplied to transistor P40. The structure is basically the same as in the second embodiment.

Transistor P43 is connected between a power supply node and node N10 and has its gate receiving signal Z4b. NMOS diode N43 is connected between nodes Z10 and GND. Transistor N44 is connected between nodes A3 and GND and has its gate connected to node Z10. Transistor N44 is connected between node B3 and GND and has its gate connected to node Z10. Transistor P43 is supplied with current Iref2. A structure is basically the same as in the second embodiment.

There is a relationship of Iref3>Iref2>Iref1 among currents Iref1, Iref2, Iref3.

Thus, in the sixth embodiment, offset currents Icom3, Icom2 respectively for reference currents Iref3 and Iref2 are generated by reference currents Iref2 and Iref1. Thus, a circuit for generating offset currents can be simply formed.

If a constant current circuit is formed such that currents Iref1, Iref2, Iref3 are respectively 10 μA, 20 μA, 30 μA, and offset currents Icom2, Icom3 are respectively 10 μA, 20 μA, the detection sensitivities at all levels can be equalized.

Figure 10A:
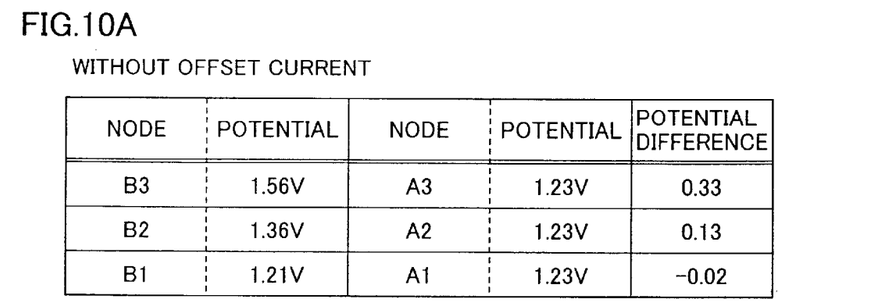
FIGS. 10A and 10B are tables respectively showing comparison results of inputs to a differential amplifier in the case of the conventional structure and the structure of the present invention shown in FIG. 7.
Figure 10B:
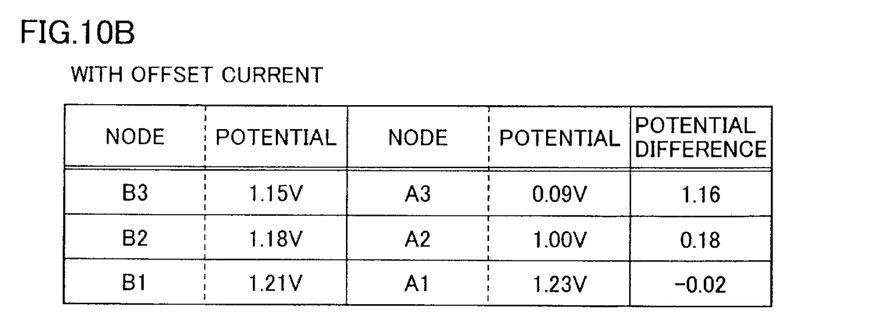

FIGS. 10A and 10B respectively show comparison results of inputs to differential amplifiers of the conventional structure and the structure of the present invention shown in FIG. 7. FIG. 10A shows the result of the conventional structure (without offset current), whereas FIG. 10B shows the result of the present invention (with offset current).

A greater potential difference is produced in the case of "with offset current," as compared with the case of "without offset current."

Seventh Embodiment

Figure 8:
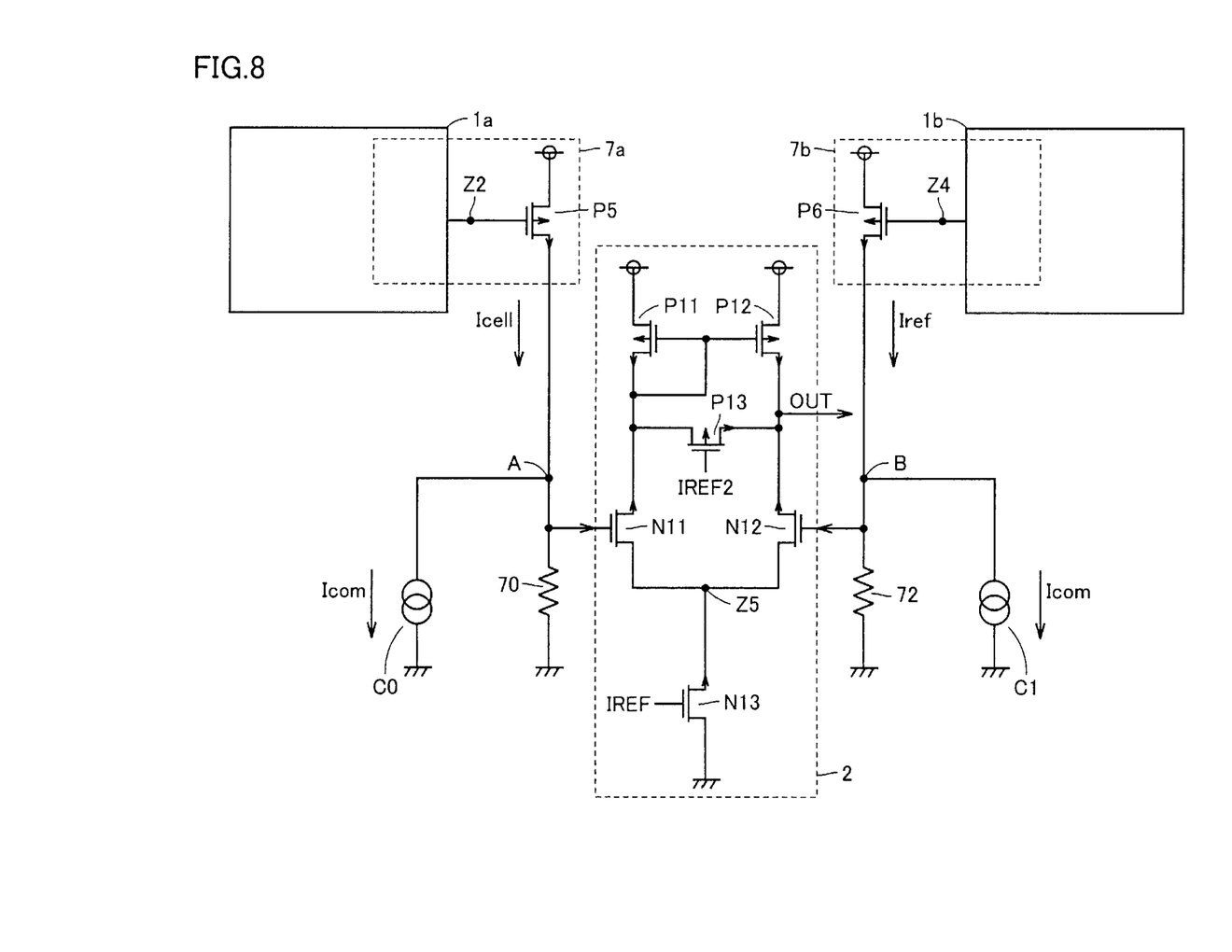
FIG. 8 is a diagram showing a main structure of a non-volatile semiconductor memory device of a seventh embodiment.

The seventh embodiment is a modification of the first embodiment. Referring to FIG. 8, a non-volatile semiconductor memory device of the seventh embodiment includes a pre-sense amplifier portion 1a corresponding to an array cell, a pre-sense amplifier portion 1b corresponding to a reference cell, a differential amplifier 2, transistors P5, P6, constant current circuits C0, C1, and resistive elements 70, 71.

The relationship among differential amplifier 2, pre-sense amplifier portion 1a, transistor P5 and constant current circuit C0 is as previously stated. A relationship among differential amplifier 2, pre-sense amplifier portion 1b, transistor P6 and constant current circuit C1 is as previously stated.

In a seventh embodiment, resistive element 70 is connected between a first input node A of differential amplifier 2 and a node GND, and a resistive element 72 is connected between the second input node B of differential amplifier 2 and node GND.

Resistive element 70 converts detected current Icell to a voltage, and resistive element 72 converts detected current Iref2 to a voltage. In the first to sixth embodiments, an NMOS diode has been illustrated as the current voltage converting element. Alternatively, if resistive element 70 or 72 is used in place of the NMOS diode, a greater detection sensitivity can obtained as in the first embodiment.

An application of the structure of the seventh embodiment to a multi-level cell will be described with reference to FIG. 9. Generally, a high resistance value is necessary to convert a small current value to a large voltage difference.

Figure 9:
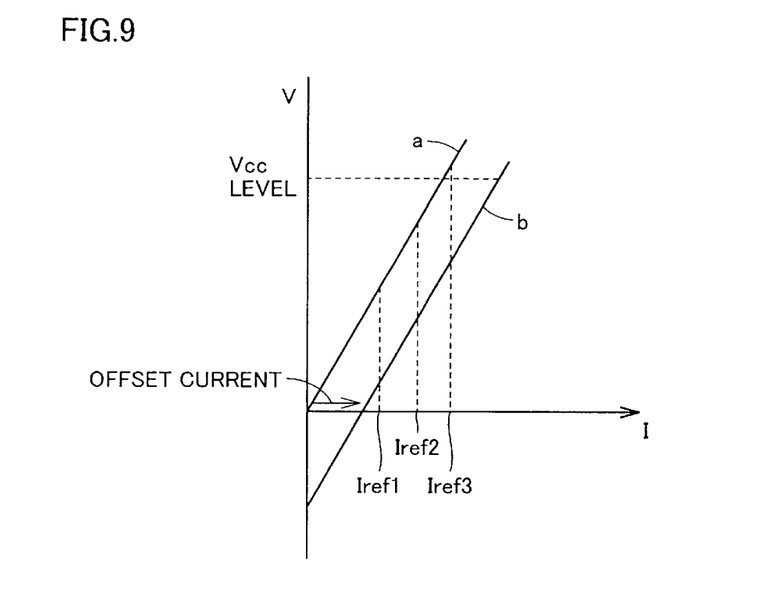
FIG. 9 is a graph showing an application of the structure of the seventh embodiment to a multi-level cell.

However, with the reading circuit corresponding to the multi-value cell, the voltage difference may exceed operation voltage Vcc when detecting high current with reference to a low current value, whereby a circuit may fail to operate properly (see a of FIG. 9).

However, according to the structure of the seventh embodiment, an offset current is supplied with use of the constant current circuit. Thus, the voltage level can be properly decreased without reducing the reading sensitivity (see b of FIG. 9).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a non-volatile memory cell;
   a reference cell for determining storage data of said non-volatile memory cell;
   a differential amplifier for detecting a difference between voltages at first and second input nodes;
   a first current voltage converting element connected to said first input node for converting a first read current from said non-volatile memory cell to a voltage;
   a second current voltage converting element connected to said second input node for converting a second read current from said reference cell to a voltage; and
   a gain adjusting circuit for adjusting a detection sensitivity of said differential amplifier by adjusting values of said first and second read currents by substantially the same value, said gain adjusting circuit including a constant current circuit for supplying offset currents to said first and second input nodes.

2. The non-volatile semiconductor memory device according to claim 1 wherein said first and second current voltage converting elements respectively include diode elements.

3. The non-volatile semiconductor memory device according to claim 2, wherein said constant current circuit includes a first constant current circuit connected to said first input node, and a second constant current circuit connected to said second input node.

4. The non-volatile semiconductor memory device according to claim 3, wherein said first and second constant current circuits supply substantially same current levels.

5. A non-volatile semiconductor memory device, comprising:
- a non-volatile memory cell;
- a reference cell for determining storage data of said non-volatile memory cell;
- a differential amplifier detecting a difference between voltages at first and second input nodes;
- a first current voltage converting element connected to said first input node for converting a first read current from said non-volatile memory cell to a voltage;
- a second current voltage converting element connected to said second input node for converting a second read current from said reference cell to a voltage; and
- a gain adjusting circuit for adjusting a detection sensitivity of said differential amplifier by adjusting values of said first and second read currents by substantially the same values wherein said gain adjusting circuit comprises:
  - a drive circuit for generating a current having a value lower than that of said second read current based on said second read current and for converting said generated current to a voltage,
  - a first element connected to said first input node for supplying a first offset current based on the voltage obtained from said drive circuit, and
  - a second element connected to said second input node for supplying a second offset current based on the voltage obtained from said drive circuit.

6. The non-volatile semiconductor memory device according to claim 5, wherein said first and second offset currents have substantially same current values.

7. A non-volatile semiconductor memory device, comprising:
- a non-volatile memory cell;
- a reference cell for determining storage data of said non-volatile memory cell;
- a differential amplifier for detecting a difference between voltages at first and second input nodes;
- a first current voltage converting element connected to said first input node for converting a first read current from said non-volatile memory cell to a voltage;
- a second current voltage converting element connected to said second input node for converting a second read current from said reference cell to a voltage; and
- a gain adjusting circuit for adjusting a detection sensitivity of said differential amplifier by adjusting values of said first and second read currents by substantially the same value wherein said gain adjusting circuit comprises:
  - a drive circuit for generating a current having a value lower than said second read current based on said second read current based on said second read and for converting said generated current to a voltage,
  - first element connected to said first input node for supplying a current having a value lower than that of said second read current to said second current voltage converting element, and
  - a second element connected to said second input node for supplying an offset current based on the voltage obtained from said drive circuit.

8. The non-volatile semiconductor memory device according to claim 1, wherein said first and second current voltage converting elements respectively include resistive elements.

9. A non-volatile semiconductor memory device, comprising:
- a non-volatile memory cell capable of operating in storage states, said n is an integer of at least 3;
- k reference cells for determining said n storage states, said k is an integer of at least 2;
- k first current voltage converting elements each converting a first read current of said non-volatile memory cell to a voltage;
- k second current voltage converting elements converting said k second read currents from said k reference cells to voltages;
- k differential amplifiers detecting differences between respective outputs from said k first current voltage converting elements and respective outputs from said k second current voltage converting elements; and
- a gain adjusting circuit adjusting each detection sensitivity of said k differential amplifiers by adjusting values of said k second read currents and said first read current,
- wherein said k first current voltage converting elements and said k second current voltage converting elements respectively include diode elements or resistive elements, and said gain adjusting circuit includes a constant current circuit for reducing input currents to said k first current voltage converting elements and at least one of said k second current voltage converting elements.

10. The non-volatile semiconductor memory device according to claim 9, wherein said gain adjusting circuit includes a constant current circuit varying input currents to said first current voltage converting element and said k second current voltage converting elements according to detection sensitivities of said k differential amplifiers.

11. The non-volatile semiconductor memory device according to claim 10, wherein said constant current circuit provides substantially same input currents to said k second current voltage converting elements.

12. The non-volatile semiconductor memory device according to claim 10, wherein said constant current circuit includes a circuit generating (k−j) offset currents using j of said k second read currents, and said (k−j) offset currents reduce input currents to (k−j) said second current voltage converting elements wherein j is an integer of at least 1 and at most (k−1).

13. The non-volatile semiconductor memory devices of claim 9, wherein said adjusting circuit adjusts values of said k second read currents and said first read current in accordance with said detected differences of said k differential amplifiers.

* * * * *